United States Patent
Inagawa

(10) Patent No.: US 8,097,133 B2
(45) Date of Patent: Jan. 17, 2012

(54) EVACUABLE MAGNETRON CHAMBER

(75) Inventor: Makoto Inagawa, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2090 days.

(21) Appl. No.: 11/184,679

(22) Filed: Jul. 19, 2005

(65) Prior Publication Data

US 2007/0017798 A1    Jan. 25, 2007

(51) Int. Cl.
*C23C 14/54* (2006.01)
(52) U.S. Cl. ......... 204/298.07; 204/298.12; 204/298.16; 204/298.2; 204/298.22; 204/298.09
(58) Field of Classification Search .............. 204/298.07, 204/298.12, 298.16, 298.2, 298.22, 298.09
See application file for complete search history.

(56) References Cited

U.S. PATENT DOCUMENTS

| | | | |
|---|---|---|---|
| 4,474,659 A * | 10/1984 | Fazlin ...................... | 204/192.12 |
| 4,663,009 A * | 5/1987 | Bloomquist et al. ....... | 204/192.2 |
| 4,824,545 A * | 4/1989 | Arnold et al. ............ | 204/298.25 |
| 5,433,835 A * | 7/1995 | Demaray et al. ......... | 204/298.09 |
| 5,529,627 A * | 6/1996 | Ocker et al. .................. | 118/623 |
| 5,876,573 A * | 3/1999 | Moslehi et al. .......... | 204/192.12 |

* cited by examiner

*Primary Examiner* — Keith Hendricks
*Assistant Examiner* — Jason M Berman

(57) ABSTRACT

A vacuum pumping system and method in conjunction with a sputter reactor having a vacuum-pumped magnetron chamber sealed to the target backing plate. A main sputter chamber is vacuum sealed to the target front and cryo pumped. A bypass conduit and valve connect the magnetron and main chambers. A mechanical roughing pump connected to the magnetron chamber pumps the main chamber through the bypass conduit to less than 1 Torr before the bypass valve is closed and the cryo pump is opened and thereafter continues to pump the magnetron chamber to reduce the pressure differential across the target. A pressure differential switch connected across the bypass valve immediately open it whenever the pressure differential exceeds a limit, such as 20 Torr, for example when there is a leak or an electrical failure. The bypass conduit is also used in a venting procedure.

18 Claims, 3 Drawing Sheets

EVACUABLE MAGNETRON CHAMBER

FIELD OF THE INVENTION

The invention relates generally to sputtering of materials. In particular, the invention relates to the vacuum pumping system of the sputtering chamber.

BACKGROUND ART

Sputtering is a well established technology in the fabrication of silicon integrated circuits in which a metal target is sputtered to deposit target material onto the silicon wafer. In recent years, sputtering has also been applied for similar purposes in the fabrication of flat panel displays, such as flat computer displays and large flat televisions and the like. Various types of flat panel displays may be fabricated typically including thin film transistors (TFTs) formed on large thin insulating rectangular substrates, often called panels, such as glass or polymer and including liquid crystal displays (LCDs), plasma displays, field emitters, and organic light emitting diodes (OLEDs). Almost all panel fabrication equipment is distinguished by its large size. The original generation was based on panels having lateral dimensions of the order of 480mm: The newest generation contemplates panel sizes above 2m on a side. This large size has introduced several problems not experienced in wafer fabrication equipment limited to sizes of about 300mm in the most recent equipment.

A conventional flat panel sputter reactor 10 is schematically illustrated in the cross-sectional view of FIG. 1. Demaray et al. disclose more details of such a reactor in U.S. Pat. No. 5,565,071, incorporated herein by reference. A pedestal 12 within a main vacuum processing chamber 14 supports a panel 16 to be sputter coated in opposition to a target 18 bonded to a backing plate 20, which is sealed to but electrically isolated from the processing chamber 14. The target 18 may include one or more target tiles bonded to the backing plate 20. Argon sputtering gas is admitted to the main chamber 14 from an argon gas source 22 through a mass flow controller 24. A high-vacuum pump 26, for example, a cryo pump, is connected to the vacuum processing chamber 14 through a gate valve 28 and maintains a base pressure within the processing chamber 14 in the range of about $10^{-6}$ to $10^{-7}$ Torr but the argon pressure is typically kept in the milliTorr range for plasma sputtering. An unillustrated DC power supply electrically biases the target 18 to a sufficiently large negative voltage with respect to the pedestal 12 or the processing chamber 14 or a shield contained therein to excite the argon into a plasma. The positive argon ions are strongly attracted to the negatively biased target 18 to sputter material from it, which then strikes the panel 16 and coats material of the target onto the panel 16. In reactive sputtering, a reactive gas such as nitrogen is additionally admitted into the processing chamber 14 for react with sputtered metal to form a metal nitride. Still, the chamber pressure is maintained in the milliTorr range or below.

A magnetron 30 having opposed magnetic poles is positioned in back of the target 18 and backing plate 20 to create a horizontal magnetic field across the sputtering face of the target 18, which thereby intensifies the plasma and increases the sputtering rate. The form of the magnetron 30 is typically considerably more complex than that illustrated. The magnetron 30 is scanned in one or two dimensions about the back of the backing plate 20 to provide uniform deposition and target erosion. In wafer sputter reactors, the magnetron 30 is typically enclosed in a cooling water bath, which cools the target 18, which can become very hot under continued sputtering. However, such a configuration is unpractical with sputter reactors for large panels. The backing plate 20 and target 18 must be relatively thin to allow the magnetic field from the backside magnetron 30 to project through them. However, the very large size of the target means that the backing plate 20 would need to withstand an enormous force between the high vacuum within the vacuum processing chamber 14 and atmospheric pressure (760 Torr or 14 pounds per square inch) plus the weight and hydrostatic pressure of the cooling water. This problem is circumvented by forming liquid cooling channels within the relatively thin backing plate 20 and supplying coolant from outside the processing chamber 14 to cool the backing plate 20 and attached target 18. A magnetron chamber 32 surrounding the magnetron 30 is formed at the back of the backing plate 20 and is vacuum sealed to it. The magnetron chamber 32 is vacuum pumped, for example, to less than 1 Torr, more typically 200 to 500 milliTorr, thereby greatly reducing the force that the backing plate 20 must stand off.

Conventionally, a mechanical roughing pump 34 pumps the magnetron chamber 32 through a roughing valve 36 to the requisite sub-Torr pressure and maintains it there during panel processing. The cryo pump 26 is a high vacuum pump which is very effective at very low pressures but cannot be operated at pressures very much above 1 Torr. Therefore, when the main chamber 14 is being pumped down from atmospheric pressure at the beginning of operation, the same roughing pump 34 also pumps the processing chamber 14 through a second roughing valve 38 while the cryo gate valve 28 is closed. When the roughing pump 34 reduces the pressure in the main chamber 14 to a cross-over pressure of about 200 to 500 milliTorr, the second roughing valve 38 is closed and the cryo gate valve 28 is opened to allow the cryo pump 26 to further reduce the pressure within the main chamber 14 to the requisite pressure below $10^{-6}$ Torr. But, the first roughing valve 36 remains open so that the roughing pump 34 continues to pump the magnetron chamber 32 to a sub-Torr pressure.

In operation, panels 16 are inserted into the main chamber 14 through a slit valve 40 from a central transfer chamber held in the range of about $10^{-3}$ to $10^{-6}$ Torr. For an in-line system, two slit valves are positioned on opposed sides of the main chamber 14 to allow panels 16 to pass along a line of vacuum isolated chambers. The invention is not limited by the configuration of the larger system incorporating the sputter reactor of the invention.

The conventional pumping system, however, suffers several drawbacks. During pump down from 760 Torr, the pressure differential across the backing plate 20 must be minimized, for example, to less than 20 Torr. Pumping rates need to be matched between the two chambers 14, 32 and their operation needs to carefully timed to avoid excessive differential pressure across the target backing plate 20 during pump down. Also, when the main chamber 14 is vented to atmosphere for maintenance, the two chambers 14, 32 need to be brought up to atmospheric pressure at the same rate. Failure or miscontrol of one or the other valves 36, 38 can cause quick excursion of pressure in only one of the chambers 14, 32. Pump failure must be immediately addressed because atmosphere may back flow through either failed pump 34, 26, quickly increasing the pressure differential. A chamber leak needs to be quickly detected and pumping adjusted accordingly. In case of power or computer failure, the states of the valves 28, 36, 38 and pumps 26, 34 become uncertain. Any pressure differential of greater than about 20 Torr at a maximum will cause the backing plate 20 to excessively bend, perhaps causing the bonded target 18 or multiple target tiles to delaminate from the backing plate 20. Large pressure differentials may cause the backing plate 20 to permanently deform and even fracture. Large sputtering targets, particularly of refractory materials such as molybdenum, are exceedingly expensive and target failures due to pumping accidents need to be minimized.

SUMMARY OF THE INVENTION

A vacuum pumping system vacuum pumps a sputter reactor in which a magnetron vacuum chamber encloses a magnetron scanned in back of a sputtering target and a processing chamber in front of the sputtering target is maintained at a low pressure during sputtering. A high-vacuum pump, for example, a cryo pump, is connected to the processing chamber. A low-vacuum pump, for example, a mechanical roughing pump, or a roughing line is connected to the magnetron chamber through a roughing valve. A bypass conduit connects the magnetron and processing chamber and includes a valve, preferably a normal open (NO) valve. A pressure differential switch connected across the bypass valve detects when the pressure across the bypass valve is above an acceptable pressure differential, for example, between 1 and 30 Torr, preferably about 20 Torr, and the bypass valve is accordingly opened.

For initial pump down, a gate valve to the high vacuum pump is closed and the bypass valve is opened. The roughing valve is opened to allow the roughing pump to pump both the magnetron and processing chambers to a moderately low pressure. When the pressure reaches a cross-over pressure, the bypass valve is closed and the gate valve to the high vacuum pump is opened.

For system venting, the gate valve to the high vacuum pump is closed, the bypass valve is opened, and a vent valve is opened to atmosphere.

DETAILED DESCRIPTION OF THE PREFERRED EMBODIMENTS

Figure 1:
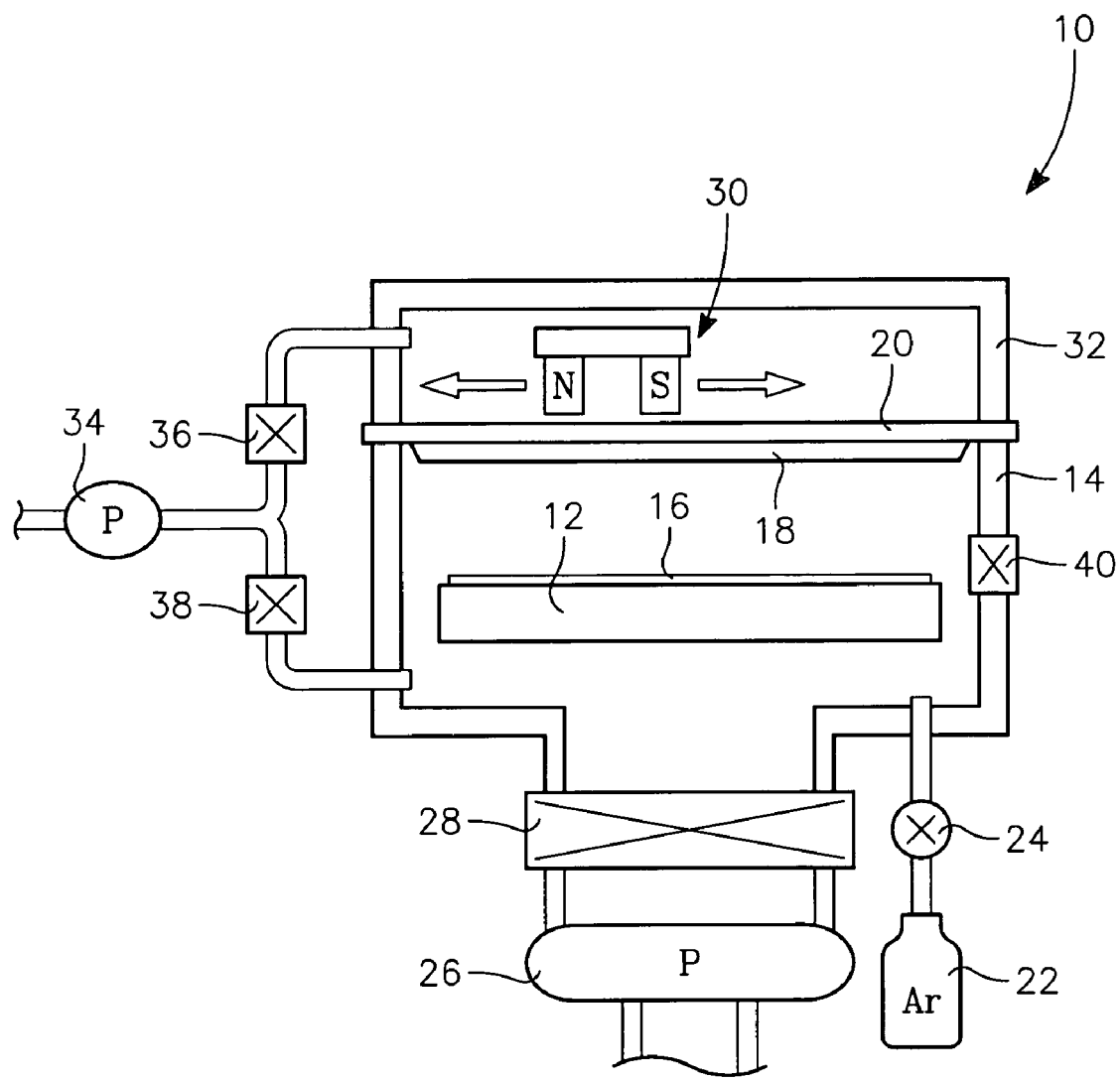
FIG. 1 is a schematic cross-sectional view of a sputter reactor including conventional vacuum pumping.
Figure 2:
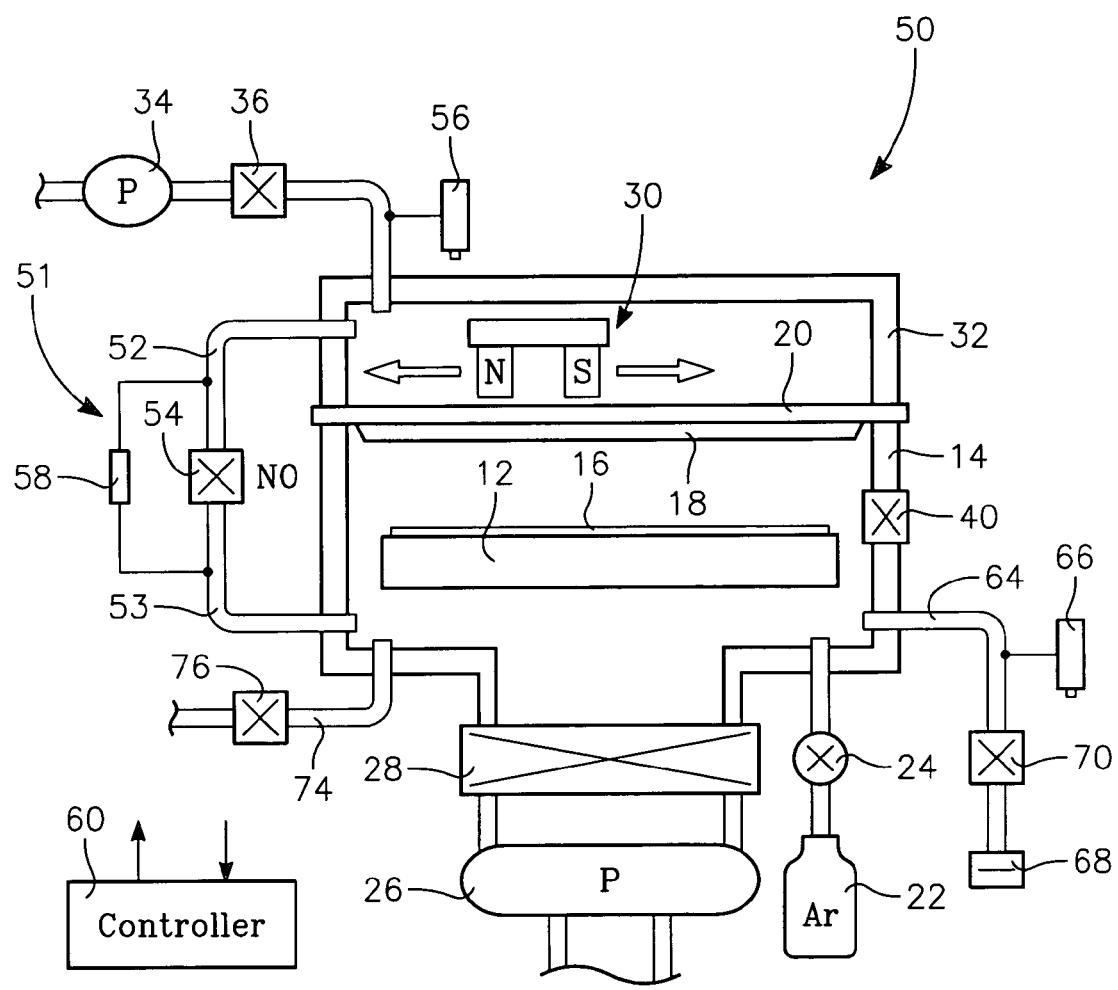
FIG. 2 is a schematic cross-sectional view of a sputter reactor including a first embodiment of the vacuum pumping of the invention.

An inventive sputter reactor 50, schematically illustrated in the cross-sectional view of FIG. 2, differs from the conventional reactor mostly in its gas pumping and pressure monitoring. The mechanical roughing pump 34 is connected to the magnetron chamber 32 through the roughing valve 36 to rough pump both the magnetron chamber 32 and the main chamber 14. A bypass conduit 51 includes a magnetron gas line 52 connected to the magnetron chamber 32 and a main chamber gas line 53 connected to the processing chamber 14 and an intermediate bypass gate valve 54. Whether the bypass gate valve 54 is open or closed determines whether the two chambers 14, 32 are vacuum isolated from each other or pressure equalized. In this embodiment, it is preferred that there be no other valving on the bypass conduit 51. With this configuration, there is no need for a direct connection from the roughing pump 34 to the main chamber 14 since the roughing pump 34 can pump the processing chamber 14 through the opened bypass valve 54. It is understood that the facility may provide a rough pumping line to multiple systems with one such roughing valve 36 coupled to the common rough pumping line and dedicated to each system such as this reactor 50. A medium-pressure roughing vacuum gauge 56, such as a convectron gauge, measures the pressure on the roughing line, which is typically above 100 milliTorr, approximately the lower pressure limit of the mechanical roughing pump 34.

The bypass valve 54 is preferably a normally open (NO) valve. That is, a positive signal or power must be applied to the NO bypass valve 54 to shut it. In the absence of such a positive signal or power, a spring or other passive means causes the NO bypass valve 54 to open, thereby linking the main and magnetron chambers 14, 32. Therefore, in the case of a power outage or many types of computer failures, the bypass valve 54 opens up to equalize pressure between the two chambers 14, 32.

A differential pressure switch 58 is coupled to the bypass conduit 51 across the bypass valve 54. The differential pressure switch 58 senses when an excessive pressure differential develops in either direction across the closed bypass valve 54 and thus between the two chambers 14, 32. If the differential pressure exceeds a predetermined pressure differential limit, for example, of 20 Torr, the bypass valve 54 is opened to equilibrate the pressure between the two chambers 14, 32 and hence to reduce the differential pressure across the backing plate 20. The differential pressure switch 58 is linked either directly to the bypass valve 54 or through a controller 60, which senses all the measured pressures and controls all the valves, or through dedicated electronics separate from the controller 60. A differential pressure limit of 20 Torr is considered reasonable. However, other pressure limits preferably below 30 Torr and preferably greater than 1 Torr may be used. Differential pressures beyond the limit may cause the backing plate to deform enough that the target tile 18 delaminates from the backing plate 20.

In an alternative configuration, one or both ends of the differential switch 58 may be directly coupled into the processing chamber 14 or the magnetron chamber 32. Although the differential pressure switch 58 is most easily implemented as an on/off pressure detector, it is possible that it outputs values of the differential pressure to the controller 60 and that the controller 60 initiates action when the measured differential pressure exceeds the limit. Alternatively, the differential pressure switch 58 may be implemented as two pressure sensors (for example, the roughing vacuum gauge 56 and the chamber vacuum gauge 66 to be described later) on opposed sides of the bypass valve 54 and delivering respective pressure signals to the controller 60, which determines when magnitude of the pressure differential exceeds the pressure differential limit.

The pressure within the processing chamber 14 is monitored on a pressure sensing conduit 64 directly coupled into the processing chamber 14. A medium-pressure chamber vacuum gauge 66, such as a convectron gauge, is coupled to the pressure sensing conduit 64 to measure pressures above about 100 milliTorr up to atmospheric pressure. A low-pressure vacuum gauge 68, such as a capacitance manometer gauge, is coupled to the pressure sensing conduit 64 through a gauge isolation valve 70. The low-pressure vacuum gauge 68 is sensitive to pressures from about 1 Torr down to $10^{-8}$ Torr and below. Such low-pressure vacuum gauges may have a diaphragm construction or rely on hot filament emission and need to be protected from pressures significantly above 1 Torr. Accordingly, it is typical practice to open the isolation valve 70 only when the main chamber pressure has been reduced to the cross-over pressure or less.

Occasionally, the processing chamber 14 needs to be open for maintenance or replacement of the target assembly 18, 20. For these situations, a vent conduit 74 with a vent valve 76 is connected to the main chamber 14 (or possibly the magnetron chamber 14) to vent the system to atmosphere. In normal operation the vent valve 76 is kept closed.

Figure 3:
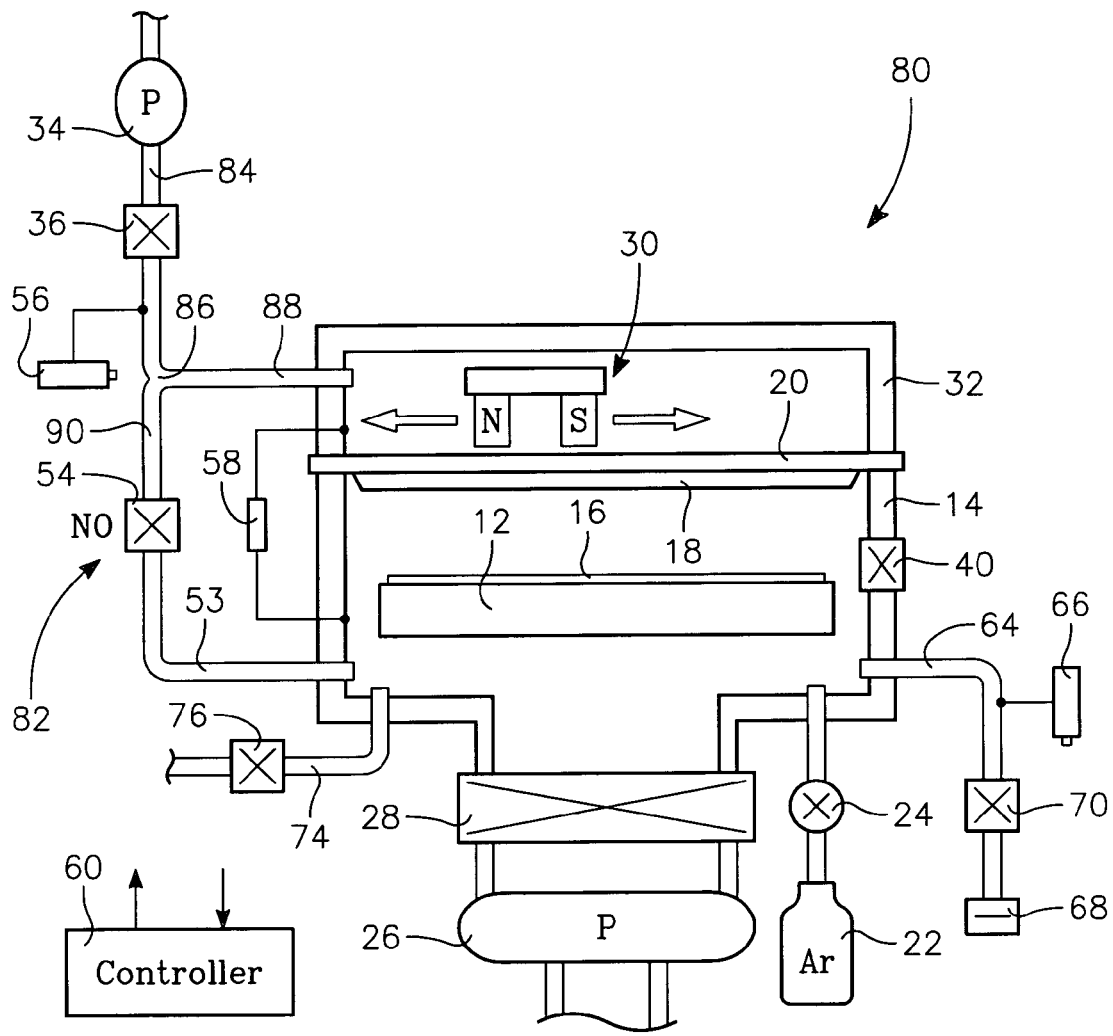
FIG. 3 is a schematic cross-sectional view of a sputter reactor including a second embodiment of the vacuum pumping of the invention.

A sputter reactor 80, schematically illustrated in the cross-sectional view of FIG. 3, of another embodiment of invention relies upon the conventional pumping ports to the processing and magnetron chambers 14, 32 and may form a bypass conduit 82 in hosing or easily configured elements. The roughing valve 36 is connected between a roughing line 84 and series of hosing or piping including a Y-coupling 86. A single magnetron gas line 88 connects the magnetron chamber 32 to the Y-coupling 86. A bypass gas line 90 connects the Y-coupling 84 to the bypass valve 54. The main chamber gas line 53 connects the bypass valve 90 to the processing chamber 14. Thus, the bypass conduit 82 is constituted by the magnetron gas line 88, the Y-coupling 86, the bypass line 90, and the main chamber gas line 53. As a result, existing sputter reactors can be reconfigured in the field to the inventive pumping arrangement. This figure also shows the pressure differential switch 58 connected directly between the processing and magnetron chambers 14, 32 although it could easily be connected between magnetron or bypass line 88, 90 and the main chamber line 53 or some combinations of a chamber and a gas line.

The pump down procedure will now be described assuming that the two chambers 14, 32 have been closed but remain at atmospheric pressure. The slit valve 40, roughing valve 36, isolation valve 24, and high-pressure gate 28 are assumed to be closed and the mass flow controller 24 may remain closed during pump down. At the beginning of pump down, the controller 60 determines that the bypass valve 54 is opened and it closes the vent valve 76. Thereafter, the controller 60 opens the roughing valve 36 and the roughing pump 34 begins to pump the magnetron chamber 32 and also pump the main chamber 14 through the bypass conduit 51, 82. When the controller 60 determines from both medium-pressure vacuum gauges 56, 66 that the chamber pressure is reduced below the cross-over pressure, it opens the high-vacuum gate valve 28 and the gauge isolation valve 70 and closes the bypass valve 54. The roughing pump 34 continues to pump the magnetron chamber 14 and the high-vacuum pump 26 pumps the main chamber 14. When the controller 60 determines from the high-vacuum gauge 68 that the pressure in the main chamber 14 has been reduced to normal base pressures, for example, below $10^{-6}$ Torr, the pump down procedure is complete. Thereafter, the controller 60 controls the slit valve 14 and mass flow controller 24 as well as the power supply for the target 18 to sputter process a sequence of panels 16.

The venting procedure is initiated with the slit valve 14 and the mass flow controller 24 closed. The controller 60 shuts the gauge isolation valve 70 and the high-vacuum gate valve 28 and immediately opens the bypass valve 54 to connect the main chamber 14 to the magnetron chamber 14. Thereafter, the controller 60 closes the roughing valve 36 and then opens the vent valve 74 to vent both chambers 14, 32 to atmosphere. Thereafter, the magnetron chamber 32 may be removed from the backing plate 20 and the backing plate 20 and attached target 18 removed from the processing chamber 14.

If a leak occurs in either chamber 14, 32 during operation or in the case of other types of failures, the bypass pressure differential pressure switch 58 senses a differential pressure excursion above the limit and automatically senses the excess pressure and flags an interrupt to the controller 60, which immediately opens the bypass valve 54. The cryo pump 26 or high-vacuum gauge 68 may be damaged if their valves 28, 70 are not closed in time, but at least the expensive target/backing plate assembly 18, 20 is not irreparably damaged. The low-pressure or high-pressure chamber vacuum gauge 66, 68 can optionally flag a high-pressure condition in the main chamber 14.

If a leak occurs in either chamber 14, 32 during operation or in the case of other types of failures, the bypass pressure differential pressure switch 58 sense a differential pressure excursion above the limit and automatically senses the excess pressure and flags an interrupt to the controller 60, which immediately opens the bypass valve 54. The cryo pump 26 or high-vacuum gauge 68 may be damaged if their valves 28, 70 are not closed in time, but at least the expensive target/backing plate assembly 18, 20 is not irreparably damaged. The low-pressure or high-pressure chamber vacuum gauge 66,. 68 can optionally flag a high-pressure condition in the main chamber 14.

Although the invention has been described for use with flat panel sputtering, it may be advantageous to implement a sputter reactor for sputtering onto substantially circular silicon wafers, especially those of larger sizes, which includes a thin target/backing plate assembly with liquid cooling channels therein and a vacuum-pumped magnetron chamber. Wafer reactors typically have magnetron which is rotated about the central axis. The invention can be advantageously applied in such a wafer reactor.

The invention thus provides a simplified but more dependable vacuum pumping system.

The invention claimed is:

1. A sputtering system, comprising:
   a main chamber for holding a substrate to be sputter coated and being vacuum sealable on a side opposite the substrate with a sputtering target and connectable to a high-vacuum pump capable of pumping the main chamber to a pressure below 1 milliTorr;
   a magnetron chamber configured to include a scanning magnetron and to be vacuum sealable to the target;
   a roughing valve connected between a vacuum roughing line and the magnetron chamber, wherein a flow path between the vacuum roughing line and the magnetron chamber passing through the roughing valve does not pass through the high-vacuum pump or the main chamber; and
   a bypass conduit connecting the magnetron chamber and the main chamber and including a bypass valve, whereby a selection of a state of the bypass valve determines whether a pressure differential may exist between the main chamber and the magnetron chamber or whether pressures in the main chamber and the magnetron chamber are equalized.

2. The sputtering system of claim 1, wherein the bypass valve is normally open.

3. The sputtering system of claim 2, wherein no valve other than the bypass valve is included on the bypass conduit between the main chamber and the magnetron chamber.

4. The sputtering system of claim 1, wherein the target includes a backing plate with internal liquid cooling channels and at least one target tile bonded to the backing plate.

5. The sputtering system of claim 1, further comprising a pressure differential switch connected around the bypass valve capable of detecting a pressure differential above a differential pressure limit and wherein the bypass valve is operatively controlled according to an output of the pressure differential switch.

6. The system of claim 1, further comprising a gate valve between the main chamber and the high-vacuum pump.

7. The system of claim 6, wherein the high-vacuum pump is a cryo pump.

8. The system of claim 1, further comprising a mechanical roughing pump vacuum pumping the roughing line.

9. The system of claim 1, further comprising:
   a roughing pressure gauge coupled to one of the main chamber and the magnetron chamber and capable of measuring a pressure provided by the roughing line;
   a gate valve connecting the main chamber to the high-vacuum pump;
   an atmospheric vent line including a vent valve connected to one of the main and magnetron chambers; and
   a controller receiving signals from the roughing pressure gauge and controlling the roughing valve, the bypass valve, and the gate valve and including instructions for executing a pump down procedure and a vent procedure.

10. The system of claim 9, wherein the controller additionally receives signals from the pressure differential switch.

11. The system of claim 1, wherein the substrates are rectangular panels.

12. The system of claim 1, wherein the substrates are circular silicon wafers.

13. A sputtering system, comprising:
   a main chamber for holding a substrate to be sputter coated;
   a high-vacuum pump connected to the main chamber through a gate valve;
   a sputtering target sealed to the main chamber;
   a magnetron chamber sealed to a side of the sputtering target opposite the main chamber and enclosing a scannable magnetron;
   a roughing valve connected between a vacuum roughing line and the magnetron chamber, wherein a flow path passing through the roughing valve does not pass through the high-vacuum pump or the main chamber; and
   a bypass conduit connecting the magnetron chamber and the main chamber and including a bypass valve.

14. The system of claim 13, further including a pressure differential switch system connected around the bypass valve for detecting a pressure differential above a differential pressure limit.

15. The system of claim 14, wherein the pressure differential switch system, comprises:
   a first pressure sensor coupled to the magnetron chamber;
   a second pressure sensor coupled to the main chamber; and
   a controller controlling said bypass valve and comparing pressures sensed by the two pressure sensors.

16. The system of claim 13, further comprising:
   a roughing pressure gauge coupled to one of the main chamber and the magnetron chamber and capable of measuring a pressure provided by the roughing line; and
   an atmospheric vent line including a vent valve connected to one of the main and magnetron chambers.

17. The system of claim 16, further comprising a controller receiving signals from the roughing pressure gauge and controlling the roughing valve, the bypass valve, and the gate valve and including instructions for executing a pump down procedure and a vent procedure.

18. The system of claim 13, wherein the bypass valve is normally open.

* * * * *